United States Patent [19]

Schmitz

[11] Patent Number: 4,703,170

[45] Date of Patent: Oct. 27, 1987

[54] INFRARED FOCAL PLANE MODULE

[75] Inventor: Charles E. Schmitz, Irvine, Calif.

[73] Assignee: Grumman Aerospace Corporation, Bethpage, N.Y.

[21] Appl. No.: 907,408

[22] Filed: Nov. 3, 1986

Related U.S. Application Data

[63] Continuation-in-part of Ser. No. 722,776, Apr. 12, 1985, Pat. No. 4,618,763.

[51] Int. Cl.⁴ ............................................. H01J 40/14
[52] U.S. Cl. ............................... 250/211 R; 250/578; 250/332
[58] Field of Search .................. 250/332, 211 R, 578, 250/209

[56] References Cited

U.S. PATENT DOCUMENTS

| | | | |
|---|---|---|---|
| 3,852,714 | 12/1974 | Carson | 340/146.3 F |
| 3,970,990 | 7/1976 | Carson | 340/146.3 F |
| 4,304,624 | 12/1981 | Carson et al. | 156/630 |
| 4,352,715 | 10/1982 | Carson et al. | 156/634 |
| 4,354,107 | 10/1982 | Carson et al. | 250/239 |
| 4,403,238 | 9/1983 | Clark | 357/30 |
| 4,525,921 | 7/1985 | Carson et al. | 29/577 |
| 4,551,629 | 11/1985 | Carson et al. | 250/578 |
| 4,592,029 | 5/1986 | Altmann et al. | 250/578 |

Primary Examiner—Eugene R. LaRoche
Assistant Examiner—David Mis
Attorney, Agent, or Firm—Stetina and Brunda

[57] ABSTRACT

An infrared focal plane module as disclosed for interfacing a plurality of detector elements to external electronics. The module comprises a plurality of integrated circuits disposed in substantially overlapping registry to form a module body, each of the integrated circuits is formed to include a layer of semi-conductive material such as silicon disposed upon a major surface of an insulating substrate, e.g. sapphire, to form electronic circuits. Each of the integrated circuits further includes conductive areas formed along first and second edge portions of the substrate to communicate electrical signals to and from the integrated circuit.

13 Claims, 8 Drawing Figures

INFRARED FOCAL PLANE MODULE

This application is a continuation-in-part of co-pending U.S. patent application Ser. No. 722,776, now U.S. Pat. No. 4,618,763, filed for Infrared Focal Plane Module, filed Apr. 12, 1985.

BACKGROUND OF THE INVENTION

The present invention relates to a module for interfacing a plurality of infrared detector elements to external electronics. More particularly, the invention relates to a multi-layer structure having detector elements and an output interface disposed transverse to the plane of the layers.

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photoconductors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, as well as advances in semiconductor materials and highly sensitive electronic circuitry have advanced the performance of contemporary infrared detectors close to the ideal photon limit.

Current infrared detection systems incorporate arrays of large numbers of discrete, highly sensitive detector elements the outputs of which are connected to sophisticated processing circuitry. By rapidly analysing the pattern and sequence of detector element excitation, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.0035 inches on a side with 0.0005 inches spacing between detectors. The total width of such a subarray would therefore be 1.024 inches on a side. Thus, interconnection of such a subarray to processing circuitry requires a connective module with sufficient circuitry to connect each of the 65,536 detectors to processing circuitry within a square a little more than one inch on a side. The subarrays may, in turn, be joined to form an array that includes 25 million detectors or more. Considerable difficulties are presented in aligning the detector elements with conductors on the connecting module and in isolating adjacent conductors in such a dense environment.

The outputs of the detectors must undergo a series of processing steps in order to permit derivation of the desired information. The more fundamental processing steps include preamplification, tuned bandpass filtering, clutter and background rejection, multiplexing and fixed noise pattern suppression. By providing a detector connecting module that performs at least a portion of the signal processing functions within the module, i.e. on integrated circuit chips disposed adjacent the detector focal plane, the signal from each detector need be transmitted only a short distance before processing. As a consequence of such on-focal plane or "up front" signal processing, reductions in size, power and cost of the main processor may be achieved. Moreover, up front signal processing helps alleviate performance, reliability and economic problems associated with the construction of millions of closely spaced conductors connecting each detector element to the main signal processing network.

Various constructions have been proposed to support the necessary connectivity and processing functions of the module. Those constructions have heretofore included the formation of a multi-layer passive substrate having metalized patterns formed thereon. Electronic devices such as integrated circuits are mounted on one or more of the substrate layers and connected to the metalized patterns to communicate signals between the electronic devices and the detector elements or external electronics. Each layer of the module is formed to be sufficiently thin such that adjacent metalized patterns correspond to the center-line spacing of the detector elements. The electronic devices, typically having a thickness greater than the center-line spacing of the adjacent detector elements, are disposed on the surface of the layers in multi-layer cavities extending transverse to the plane of the array. Thus, the metalized patterns may be spaced to correspond to the detector center line spacing regardless of the thickness of the electronic devices. Because there is typically substantial flexibility in the Z dimension of the module, a substantial number of electronic devices may be disposed within the cavities without affecting the thickness of the layers or the ability of the layers to conform to detector center line spacing.

Though such contemporary modules provide a generally satisfactory structure for interfacing a detector array and external electronics, they are subject to a number of inherent limitations and practical difficulties in their construction. The passive substrate that serves as a chassis to support connectors and electronic devices inherently adds substantial bulk to the module, introduces difficulties with respect to the accurate formation and alignment of the conductive patterns on the layers, and presents substantial difficulties and necessitates substantial expense in connection with the mounting and interconnection of the electronic devices to the conductive patterns.

SUMMARY OF THE INVENTION

An infrared focal plane module as disclosed for interfacing a plurality of detector elements to external electronics. The module comprises a plurality of integrated circuits disposed in substantially overlapping registry to form a module body, each of the integrated circuits is formed to include a layer of semi-conductive material such as silicon disposed upon a major surface of an insulating substrate, e.g. sapphire to form electronic circuits. Each of the integrated circuits further includes conductive areas formed along first and second edge portions of the substrate to communicate electrical signals to and from the integrated circuit.

The conductive material may be formed to define circuits for buffering or receiving output signals from interconnected detector array segments. Each of the integrated circuits may be formed to be substantially identical and may be constructed to have a thickness between 0.004 to 0.020 inches thick.

DETAILED DESCRIPTION OF THE DRAWINGS

In accordance with the present invention, a plurality of integrated circuits 11 are formed stacked in substantially overlapping registry with insulating adhesive layers 13 disposed between adjacent integrated circuits. Each integrated circuit is preferably formed as a multichannel device adapted to receive signals from an adjacent infrared detector array, process the received signal and communicate the processed signals to external electronics. Circuits suitable for performing the receiving and buffering functions of the integrated circuit 11 are disclosed in the co-pending patent application of William J. Parrish titled Input Circuit for Infrared Detector, assigned to the common assignee. It should be noted however that various input and processing circuits may be used to implement the functions of the integrated circuit 11 without departing from the spirit or scope of the claimed invention.

Figure 1:
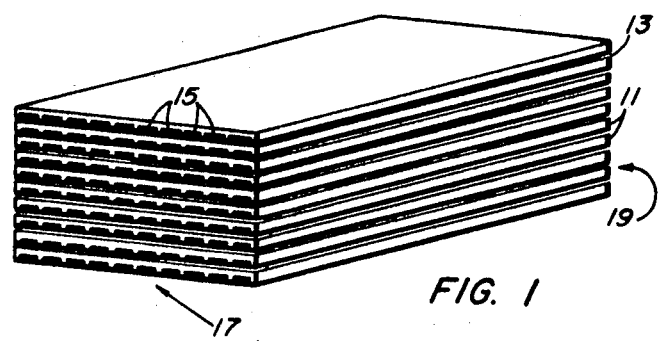
FIG. 1 is a perspective view of stacked integrated circuits having exposed conductive areas along an edge portion thereof.

Each integrated circuit 11 is provided with conductors extending to first and second edge portions thereof. As shown in FIG. 1, conductors extend to the front edge 19 of each integrated circuit 11. Similar conductors extend to the back edge 19 of each integrated circuit 11. The conductors may be exposed by any of a variety of well-known techniques, including diamond grinding and polishing the front and back edges of the integrated circuit 11. The exposed areas of each conductor may be provided with a metalized pad formed transverse to the exposed edge portions. The metalized pads facilitate electrical contact between the conductors on the integrated circuit and the structure bonded thereto.

Figure 2:
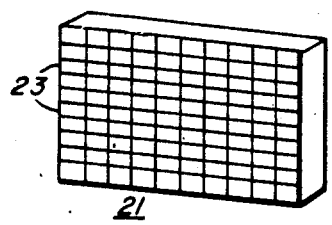
FIG. 2 is a perspective view of an infrared detector array segment adapted for connection to the integrated circuit layers.
Figure 4:
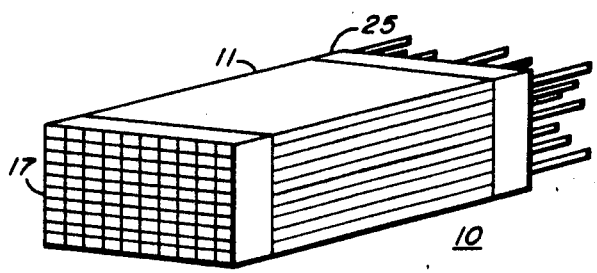
FIG. 4 is a perspective view of a module formed in accordance with the present invention.

As shown at FIGS. 2 and 4, an infrared detector array segment 21 is bonded to the stacked integrated circuits, transverse to the orientation of the layers. Detector array segment 21 is formed of a plurality of discrete detector elements 23. Each element is connected to a dedicated channel on one of the integrated circuits through connections between the detector element connectors and the metalized pads. Traditional soldering techniques (solder-bump reflow, solder cream fusion, etc.), or flip chip bonding techniques (e.g. using aluminum or indium as the interfacing metalic medium) may be used to join the detector element connectors to the metalized pads. For certain applications it may be advantageous to make the integrated circuit layers extremely thin. The thinness of the layers may be limited, however, by the semiconductive properties of the substrate, e.g. the necesary depth of the diffusion layer, and the mechanical properties of the substrate.

FIG. 2 illustrates an array of infrared detector elements suitable for connection to the stacked integrated circuits, as illustrated at FIG. 4. Array portions 21 are formed to have a square surface area including a field of detector elements formed on the surface thereof. The detector field may typically be 128×128, 64×64, or 32×32 detector elements. Accordingly, module 10 is formed to have the same number of integrated circuits 11, i.e. 128, 64 or 32, vertically stacked in abutting electrical connection with detector array 21. Each integrated circuit 11 will also have the same number of channels, with each channel connected to a dedicated detector element 23 along a linear segment of the array portion 21. The overall size of a module 10 as illustrated at FIG. 4 may be approximately 0.128 inches long, 0.128 inches wide and 0.5 inches deep. However, modules of numerous other sizes may be constructed within the scope of the present invention. For example, the depth of the module is typically selected in view of the intended on focal plane signal processing.

The detector elements may be formed of any of a plurality of photovoltaic materials such as HgCdTe, Pt-Si or InSb, or photoconductive materials such as PbS. The desired center line spacing between adjacent elements is typically a function of the intended application and performance of the detector array. It is anticipated that the present invention is likely to find most common application in connection with infrared detector arrays having center line spacing between 0.002 to 0.020 inches, though the invention is not limited to use with arrays in that range. The thickness of the layers of the module, i.e. the thickness of the integrated circuits plus the thickness of the intermediate insulating layer is designed in view of the detector centerline spacing requirements. It is anticpated that the thickness of the integrated circuits will, in practice, commonly be between 0.001 and 0.020 inches.

Each integrated circuit 11 is formed by epitaxially depositing semiconductor material such as silicon, gallium, arsonide, etc., upon a thin insulating wafer. In the presently preferred embodiment, silicon is deposited upon one surface of a thin sapphire wafer. It is expected, however, that other insulating materials may be used to form the wafer. It is also recognized that silicon may be deposited on both sides of the wafer to accomodate arrays of greater density. Wafers may be pre-thinned or post-thinned to the desired thickness, e.g. between 0.001–0.002 inches.

Contemporary bump-bonding techniques are utilized in the presently preferred embodiment to connect the detector elements to the pads formed on edge portions of the integrated circuit to elements in the detector array.

Traditional soldering techniques (solder-bump reflow, solder cream fusion, etc.), or flip chip bonding techniques may be used to join the header interface to the integrated circuit input pads.

Figure 3:
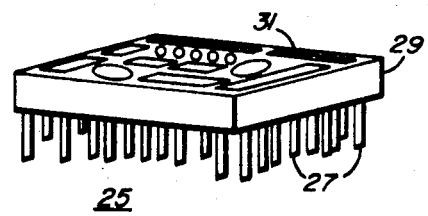
FIG. 3 is a perspective view of a module header interface adapted for connection to the integrated circuit layers.

FIG. 3 illustrates an exemplary header interface for connecting the integrated circuits to external electronics. Header pin matrix interface 25 may be formed similar to commercially available PGA arrays or SLT type headers produced by IBM. Header 25 is formed to have a plurality of electrical conductors 27 extending from the rear surface of the substrate 29. The conductors are intended to communicate signals between external electronics and conductive regions 31 formed on the front surface of substrate 29. Conductive regions 31 are adapted to interface with conductors extending to the back edge 19 of the integrated circuits 11. The conductors leading to back edge 19 of the integrated circuits 11 are exposed and may be provided with metalized pads in a manner similar to that described in connection with the front edge 17 of integrated circuits 11. Similarly, header 25 may be bonded to the stack of integrated circuits 11 in the same manner in which detector array 21 is bonded to the integrated circuits.

Figure 5:
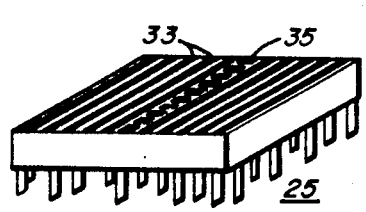
FIG. 5 is a top view of the module header interface with an alternative conductive pattern formed thereon.

In the presently preferred embodiment, each of the integrated circuits 11 is identical. Therefore, the exposed conductive areas along the back edge 19 of the integrated circuit corresond to the same input or output signal on each integrated circuit. Accordingly, as shown at FIG. 5, the conductive patterns 31 on header 25 may be formed as primarily a series of vertically extending conductors 33 in electrical communication with a column of aligned metalized pads connected to similar circuit portions on each integrated circuit. However, integrated circuit and detector channel selection addressing pad pinouts 35 would remain unique.

Figure 6:
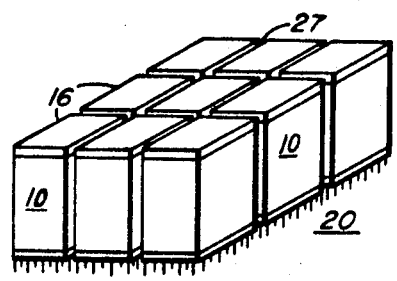
FIG. 6 is a perspective view of a plurality of modules disposed to form a subarray.

FIG. 6 illustrates a sub-array 20 comprised of a plurality of modules 10 disposed adjacent each other in a planar fashion. An insulating adhesive material may be placed in the space 27 between adjacent modules 10. Suitable insulating adhesive materials for intermodule and intramodule adhesion include PARYLENE C, a registered trademark of Union Carbide. The space 27 between adjacent modules 10 is preferably very small, e.g. one micron so as to minimize irregularity in detector centerline spacing from module to module. In practice, the modules may be formed of common substrate materials, with border spacing about the active portion of the detector elements, to eliminate the need for any module spacing or intermodule adhesive while maintaining intermodule centerline spacing the same as intramodule centerline spacing. It is anticipated that a workable array of modules 10 may be formed by aligining thousands of modules to form a focal plane.

Figure 7:
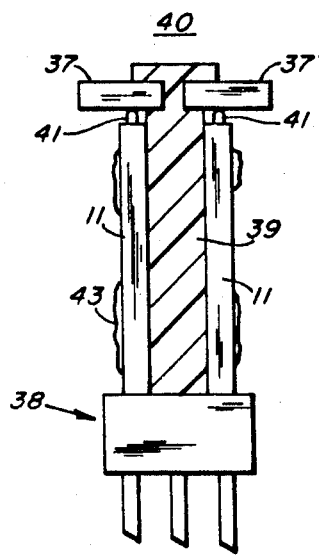
FIG. 7 is a side view of an alternative construction incorporating two integrated circuit layers.

FIG. 7 illustrates an alternative embodiment of the invention wherein a module is formed by disposing a pair of integrated circuit layers in back to back relation, and connecting each integrated circuit to a detector array segment and module header interface. The module 40 incorporates a pair of integrated circuit layers 11 having disposed conductive areas 43 formed on the surface thereof. An adhesive layer 39 secures the integrated circuit layers 11 together and extends to detector array segments 37, to secure them together also. The integrated circuit layers 11 are electrically connected to the detector elements in detector array segments 37 by electrical connectors 41, which may be implemented as bump bond connectors or the like. Module header interface 38 is connected to the integrated circuit layers 11 in a manner similar to that described above.

In practice, the integrated circuit layers 11 are preferrably formed as thin sapphire wafers having a layer of silicon epitaxially formed on the surface of the sapphire to form the integrated circuits. The circuitry formed on the surface of the sapphire wafers may be implemented to form any of a variety of circuits useful for on focal plane processing of signals from the detector array segment. Such circuitry may include counters, buffer circuits, auto zero circuits or other input circuits useful in view of the particular application.

Figure 8:
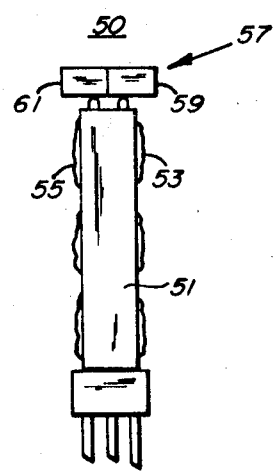
FIG. 8 illustrates another alternative embodiment wherein the integrated circuit layer is formed to have conductive areas on two surfaces.

FIG. 8 illustrates an embodiment wherein the integrated circuit layer is formed to have conductive areas 53 and 55 formed on opposite surfaces of the layer 51. The conductive areas 53 and 55 are connected to detector elements 59 and 61 respectively. The detector elements 59 and 61 may form a portion of a detector array segment 57, which may be implemented as a 2×8 detector array segment.

The integrated circuit 51 may be formed as a single layer or may be formed of a plurality of separate layers. In practice, it has been found that the use of a sapphire insulating substrate layer provides better insulating qualities than can be obtained through the use of a bulk silicon substrate. However, the invention is not intended to be limited in scope to the use of a particular substrate material.

As described above, it is anticipated that numerous variations and modifications to the presently preferred embodiment may be made without departing from the present invention. Accordingly, it should be understood that the form of the invention described above and shown in the accompanying drawings is exemplary of only the presently preferred embodiment and is not intended to limit the scope of the present invention.

What is claimed is:

1. An infrared focal plane module for interfacing a plurality of detector elements to external electronics comprising:

a plurality of integrated circuits disposed in substantially overlapping registry to form a module body, each of said integrated circuits comprising a layer of semi-conductive material disposed upon a major surface of an insulating substrate to form electronic circuits upon the surface of the substrate, each of said integrated circuits further comprising conductive areas formed along first and second edge portions of said substrate, said conductive areas being formed to communicate electrical signals to and from said integrated circuits; and an insulating layer disposed between adjacent integrated circuits.

2. The module as recited in claim 1 wherein said insulating substrate comprises a sapphire wafer.

3. The module as recited in claim 1 wherein said integrated circuits are each formed to have a plurality of channels.

4. The module as recited in claim 1 further comprising a plurality of detector elements in electrical communication with said conductive areas.

5. The module as recited in claim 1 further including a header interface in electrical communication with said conductive areas and the external electronics.

6. The module as recited in claim 1 wherein said integrated circuits comprise circuits for receiving output signals from said detector array segment.

7. The module as recited in claim 4 wherein said integrated circuits further comprise buffer circuitry.

8. The module as recited in claim 1 wherein said layer of semi-conductive material comprises a layer of silicon.

9. The module as recited in claim 1 wherein each of said integrated circuits are substantially identical.

10. The module as recited in claim 1 wherein said integrated circuit is less than 0.020 inches thick.

11. The module as recited in claim 1 wherein each integrated circuit is between 0.004 to 0.010 inches thick.

12. An infrared focal plane module fo interfacing a plurality of detector elements to external electronics comprising:

a plurality of integrated circuits disposed in substantially overlapping registry to form a module body, each of said integrated circuits comprising a layer of silicon epitaxially disposed upon a major surface of a sapphire wafer, each of said integrated circuits further comprising conductive areas formed along first and second edge portions of the wafer, said conductive areas being formed to communicate electrical signals to and from said integrated circuits; and an insulating layer disposed between adjacent integrated circuits.

13. A process for forming an infrared detection module comprising:

forming a pattern of semi-conductive material on the surface of a sapphire wafer to produce an integrated circuit;

forming exposed conductive areas on first and second edge portions of the integrated circuits;

stacking the integrated circuits in substantially overlapping registry;

disposing a layer of insulating material between adjacent integrated circuits;

disposing a plurality of infrared detector elements transverse to the plane of said integrated circuits, said detector elements being in electrical communication with said integrated circuit first edge portions; and disposing a header interface transverse to the plane of said integrated circuits, said header interface being in electrical communication with said integrated circuit second edge portions.

* * * * *